United States Patent
Ch'ng et al.

(10) Patent No.: US 9,299,404 B1
(45) Date of Patent: Mar. 29, 2016

(54) METHODS AND APPARATUS FOR PERFORMING BOOSTED BIT LINE PRECHARGE

(71) Applicant: Altera Corporation, San Jose, CA (US)

(72) Inventors: Chin Ghee Ch'ng, Gelugor (MY); Wei Yee Koay, Bayan Lepas (MY); Eu Geen Chew, Batu Maung (MY)

( * ) Notice: Subject to any disclaimer, the term of this patent is extended or adjusted under 35 U.S.C. 154(b) by 231 days.

(21) Appl. No.: 13/796,859

(22) Filed: Mar. 12, 2013

(51) Int. Cl.
*G11C 7/12* (2006.01)

(52) U.S. Cl.
CPC .................................. *G11C 7/12* (2013.01)

(58) Field of Classification Search
USPC ......................................................... 365/203
See application file for complete search history.

(56) References Cited

U.S. PATENT DOCUMENTS

| | | | |
|---|---|---|---|
| 5,748,012 A | 5/1998 | Beakes et al. | |
| 6,560,141 B2 * | 5/2003 | Osada et al. | 365/154 |
| 6,859,386 B2 * | 2/2005 | Izutsu | 365/154 |
| 7,123,500 B2 | 10/2006 | Ye et al. | |
| 8,027,193 B2 | 9/2011 | Lee | |
| 8,699,291 B1 * | 4/2014 | Ch'ng et al. | 365/226 |

* cited by examiner

*Primary Examiner* — Huan Hoang
*Assistant Examiner* — Minh Dinh
(74) *Attorney, Agent, or Firm* — Treyz Law Group, P.C.; Jason Tsai (57) ABSTRACT

Integrated circuits with memory cells are provided. The memory cells may be arranged in rows and columns. Each column of memory cells may be coupled to a respective pair of data lines. The data lines may be precharged using precharge circuitry. The precharge circuitry may include n-channel precharge transistors, an equalizer transistor, an isolation transistor, a pull-down transistor, a voltage booster, and control logic. The voltage booster may provide boosted voltage signal for overdriving the n-channel transistors by pulsing a control signal. During first pulse of the control signal, the data lines may be charged up to an intermediate voltage level. During second pulse of the control signal, the data lines may be charged up to a positive power supply voltage level that is greater than the intermediate voltage level. Performing double boosted data line precharge in this way can help reduce leakage and improve memory performance.

19 Claims, 7 Drawing Sheets

METHODS AND APPARATUS FOR PERFORMING BOOSTED BIT LINE PRECHARGE

BACKGROUND

This relates generally to integrated circuits and, more particularly, to integrated circuits with memory circuitry.

Integrated circuits often contain memory elements such as random-access memory (RAM) cells. Integrated circuits that include memory cells typically have thousands of data lines (DL). Hundreds of memory cells are attached to each data line. During typical read/write operations, each data line on an integrated circuit has to be precharged to a positive power supply voltage level. Because the length of each data line is long (e.g., hundreds of microns in length) and because each data line is connected to hundreds of memory cells, the capacitance associated with each data line is fairly large.

Conventional precharge circuitry that is used for precharging the data lines includes p-type metal-oxide-semiconductor (PMOS) transistors for pulling the voltage of each data line up towards the positive power supply voltage level. The PMOS precharge transistors are typically turned on and are only turned off during read/write memory operations. The overall memory performance is often limited by the speed at which the precharge circuitry charges up the data lines. In general, data lines with larger capacitances require longer precharge durations.

One way of increasing the speed at which the precharge circuitry pulls up the data lines is to upsize the PMOS precharge transistors (i.e., to increase the device width of the PMOS precharge transistors). Upsizing the PMOS precharge transistors, however, increases static current leakage through the PMOS precharge transistors, which undesirably increases power consumption.

SUMMARY

Integrated circuits with memory cells are provided. Integrated circuits may include control circuitry that controls a memory cell array. The control circuitry may include circuitry such as addressing circuitry, data register circuitry, and read/write circuitry.

The memory cell array may include groups of memory cells arranged in rows and columns. Each column of memory cells may be coupled to a respective pair of data lines. The data lines may be precharged using precharge circuitry. The precharge circuitry may include n-channel precharge transistors that serve to pull the data line up towards a positive power supply voltage level. The precharge transistors are operable to receive a gate control signal having a boosted voltage level that is greater than the positive power supply voltage level.

The precharge circuitry may include an equalizer transistor that is coupled between each pair of data lines. The equalizer transistor may be controlled by an equalizer control signal. The precharge circuitry may further include a voltage booster circuit that can be used to generate the gate control signal. The voltage booster circuit may be controlled by associated control logic. The control logic may receive a clock signal and may be used to provide a corresponding precharge control signal for controlling the voltage booster circuit.

The precharge circuitry may also include an isolation transistor that is interposed between the voltage booster circuit and the precharge transistors. A logic OR gate may also be include that has a first input configured to receive the equalizer control signal, a second input configured to receive the precharge control signal, and an output that is coupled to the isolation transistor. The precharge circuitry may also include a pull-down transistor that is controlled by the equalizer control signal. The pull-down transistor may be used to deactivate the precharge transistors by deasserting the equalizer control signal.

In one suitable arrangement, the voltage booster circuit may be configured to output the gate control signal having the boosted voltage level when the precharge control signal is at a first value and may be configured to output the gate control signal having a nominal voltage level that is equal to the positive power supply voltage level when the precharge control signal is at a second value that is different than the first value.

The voltage booster circuit may be configured to output the gate control signal having the boosted voltage level only in response to rising and falling clock edges in the clock signal. In particular, the gate control signal with the boosted voltage level may be provided to the precharge transistor during a first time period following the falling clock edge to pull the data lines to an intermediate voltage level that is less than the positive power supply voltage level and during a second time period a predetermined amount of delay after the rising clock edge to pull the data lines to the positive power supply voltage level. The first time period may be longer than the second time period. During other time periods, the data line may be driven to the intermediate voltage level by providing a non-boosted voltage signal to the precharge transistors, where the non-boosted voltage signal exhibits the nominal voltage level.

Further features of the present invention, its nature and various advantages will be more apparent from the accompanying drawings and the following detailed description.

DETAILED DESCRIPTION

Embodiments of the present invention relate to integrated circuit memory elements and, more particularly, to precharge circuitry that is used to perform bit line precharging for the memory elements. It will be recognized by one skilled in the art that the present exemplary embodiments may be practiced without some or all of these specific details. In other instances, well-known operations have not been described in detail in order not to unnecessarily obscure the present embodiments.

The memory elements can be used in any suitable integrated circuits that use memory, including but not limited to devices such as microprocessors (or CPUs), digital signal processors (DSPs), application specific standard products (ASSPs), application specific integrated circuits (ASICs), static random-access memory (SRAM) chips, dynamic random-access memory (DRAM) chips, read-only memory (ROM) chips, programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), just to name a few.

On integrated circuits such as memory chips or other circuits in which memory is needed to store processing data, the memory elements can be used to perform the functions of static random-access memory (SRAM) cells. In the context of programmable logic device integrated circuits, the memory elements can be used to store configuration data and are therefore sometimes referred to in this context as configuration random-access memory (CRAM) cells.

Figure 1:
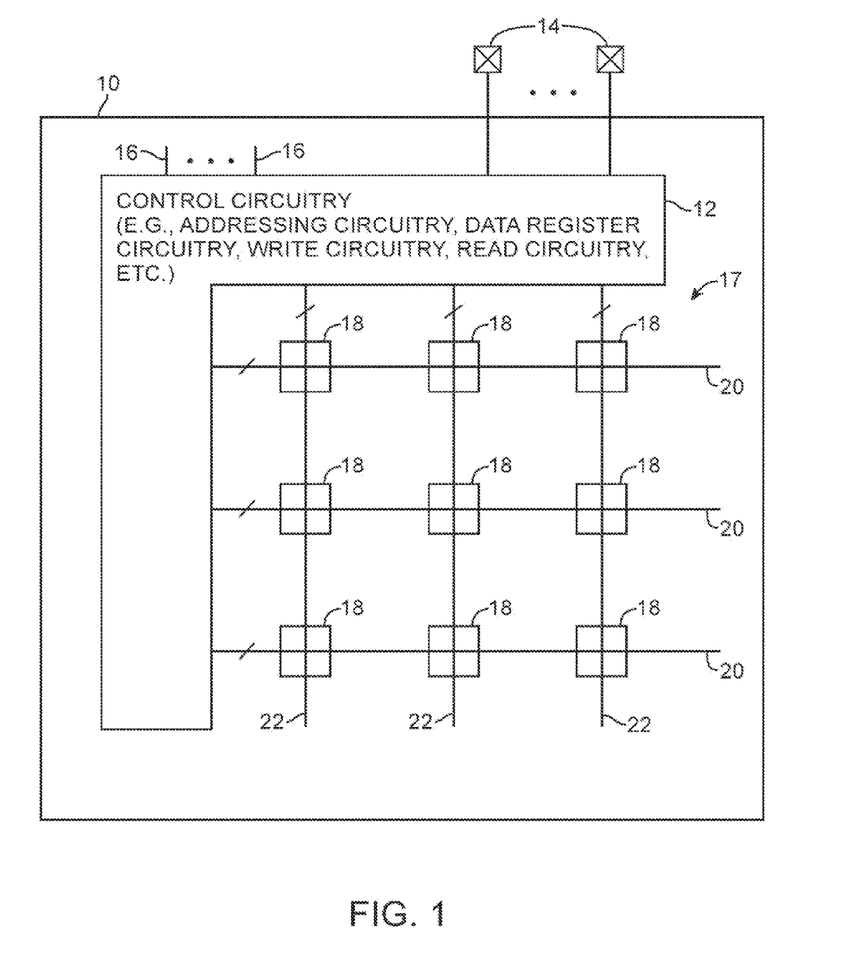
FIG. 1 is a diagram of an illustrative memory element array in accordance with an embodiment of the present invention.

FIG. 1 shows an integrated circuit that may include an array of memory elements (cells) 18. Any suitable memory array architecture may be used for memory cells 18. One suitable arrangement is shown in FIG. 1. There are only three rows and columns of memory cells 18 in the illustrative array of FIG. 1, but in general there may be hundreds or thousands of rows and columns in memory array 17. Array 17 may be one of a number of arrays on a given device 10, may be a subarray that is part of a larger array, or may be any other suitable group of memory cells 18.

Integrated circuit 10 may include control circuitry 12 for supplying signals to memory array 17. Control circuitry 12 may receive power supply voltages, data, and other signals from external sources via input-output (I/O) pins 14 and from internal sources using paths such as paths 16. Control circuitry 12 may include circuitry such as addressing circuitry, data register circuitry, write circuitry, read circuitry, etc. Control circuitry 12 may use the power supply voltages supplied by I/O pins 14 to produce desired time-varying and fixed signals on paths such as paths 20 and 22.

There may, in general, be any suitable number of conductive lines associated with paths 20 and 22. For example, each row of array 17 may have a respective path 20 that includes an address line. Each column of array 17 may have a respective path 22 that includes associated data lines (e.g., a true data line and a complement data line). If desired, a clear signal may be routed to all of the memory cells in array 17 simultaneously over a common clear line. The clear line may be oriented vertically so that there is one branch of the clear line in each path 22 or may be oriented horizontally so that there is one branch of the clear line in each path 20. The clear line need not be necessary.

Power can also be distributed in this type of global fashion. For example, a positive power supply voltage Vcc may be supplied in parallel to each memory cell 18 using a pattern of shared horizontal or vertical conductors. A ground power supply voltage Vss may likewise be supplied in parallel to memory cells 18 using a pattern of shared horizontal or vertical lines. Control lines such as address lines and data lines are typically orthogonal to each other (e.g., address lines are horizontal while data lines are vertical or vice versa).

The terms "rows" and "columns" merely represent one way of referring to particular groups of memory cells 18 in array 17 and may sometimes be used interchangeably. If desired, other patterns of lines may be used in paths 20 and 22. For example, different numbers of power supply signals, data signals, and address signals may be used.

The signals that are supplied to memory elements 18 may sometimes be collectively referred to as control signals. In particular contexts, some of these signals may be referred to as power signals, clear signals, data signals, address signals, etc. These different signal types are not mutually exclusive. For example, a clear signal for array 17 may serve as a type of control (address) signal that can be used to clear array 17. The clear signal may also serve as a type of power signal by powering inverter-like circuitry in cells 18. Likewise, because clearing operations serve to place logic zeros in memory cells 18, clear signals may serve as a type of data signal.

Positive power supply voltage Vcc may be provided over a positive power supply line. Ground voltage Vss may be provided over a ground power supply line. Any suitable values may be used for positive power supply voltage Vcc and ground voltage Vss. For example, positive power supply voltage Vcc may be 1.2 volts, 1.1 volts, 1.0 volts, 0.9 volts, less than 0.9 volts, or any other suitable voltage. Ground voltage Vss may be zero volts (as an example). In a typical arrangement, power supply voltages Vcc may be 1.0 volts, Vss may be zero volts, and the signal levels for address, data, and clear signals may range from zero volts (when low) to 1.0 volts (when high). Arrangements in which Vcc varies as a function of time, in which Vss is less than zero volts, and in which control signals are overdriven (i.e., in which control signals have signal strengths larger than Vcc-Vss) may also be used.

Figure 2:
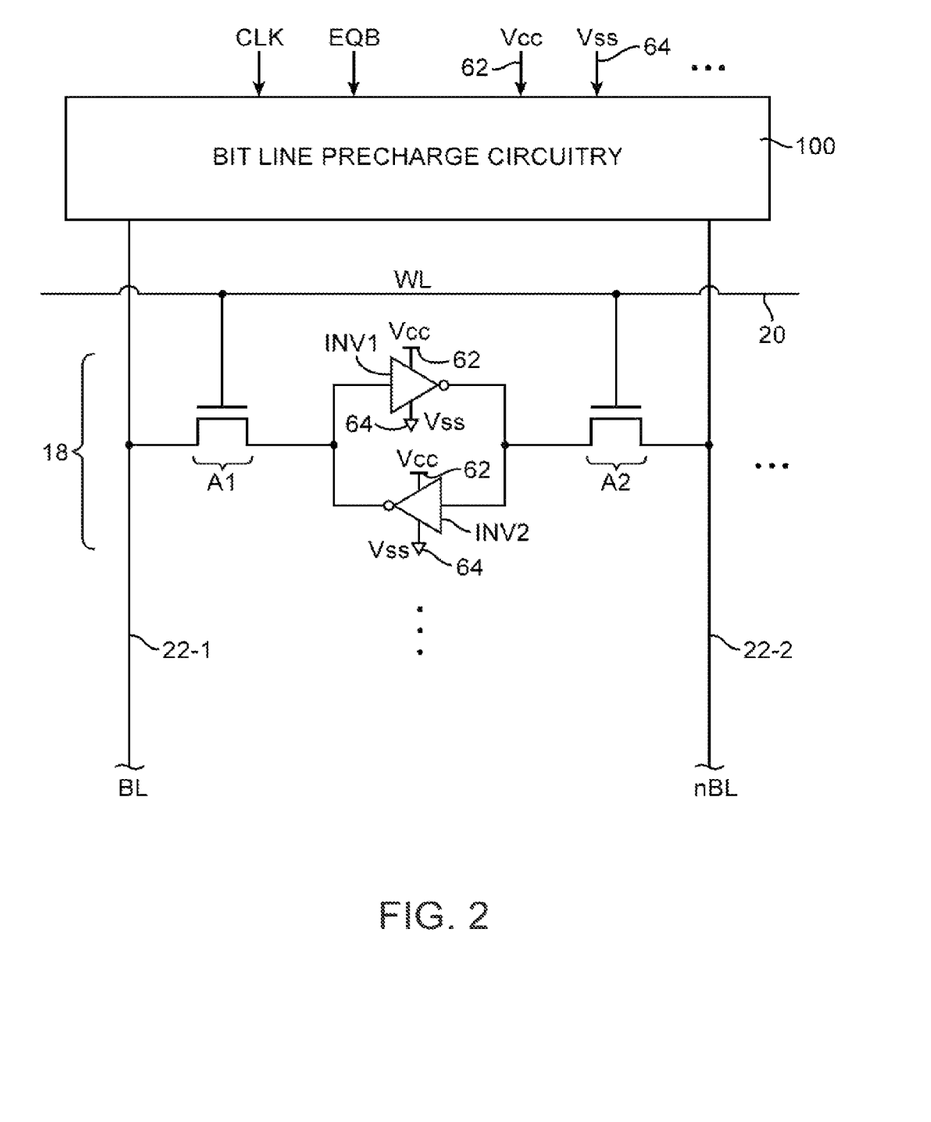
FIG. 2 is a diagram showing a group of memory elements that is coupled to data line precharge circuitry in accordance with an embodiment of the present invention.

FIG. 2 shows an exemplary memory cell 18. As shown in FIG. 2, memory cell 18 may include a storage circuit formed using a pair of cross-coupled inverters INV1 and INV2. Inverters INV1 and INV2 may each have an input and an output. The output of inverter INV1 may be coupled to the input of inverter INV2, whereas the output of inverter INV2 may be coupled to the input of inverter INV1. A storage circuit formed in this arrangement may be used to store a single bit of data and may sometimes be referred to as a bistable circuit or a latching circuit.

Inverters INV1 and INV2 may each have a first power supply terminal that is coupled to positive power supply line 62 (e.g., a positive power supply line on which positive power supply voltage Vcc is provided) and a second power supply terminal that is coupled to ground power supply line 64 (e.g., a ground power supply line on which ground voltage Vss is provided). Voltage Vcc may be 1.0 V, 0.85 V, less than 0.85 V, or other suitable voltage levels (as examples).

The output of inverter INV2 may serve as a first internal data storage node for memory cell 18, whereas the output of inverter INV1 may serve as a second internal data storage node for memory cell 18. True and complement versions of a single data bit may be stored on the first and second data storage nodes, respectively. For example, memory cell 18 may be configured to store a "1" (e.g., the first data storage node is driven high while the second data storage node is driven low) and may be configured to stored a "0" (e.g., the first data storage node is driven low while the second data storage node is driven high).

Memory cell 18 may include a first access transistor A1 that is coupled between the first data storage node and a first data line 22-1 (e.g., a first data line on which true data line signal BL is provided) and a second access transistor A2 that is coupled between the second data storage node and a second data line 22-2 (e.g., a second data line on which complement data line nBL is provided). Data lines 22-1 and 22-2 may sometimes be referred to as "bit lines." Access transistors A1 and A2 may each have a gate that is coupled to an associated address line 20 (e.g., a control line on which an address or "word line" signal WL is provided). Access transistors A1 and A2 may therefore sometimes be referred to as address transistors while address line 20 may sometimes be referred to as a word line.

During normal operation (e.g., a normal operating mode during which cell 18 holds an existing data), signal WL is deasserted (e.g., word line signal WL is held low) to turn off access transistors A1 and A2 so that the storage portion of cell 18 holds stored data values at the first and second data storage nodes. For example, memory cell 18 holding a "0" may have the first data storage node at logic "0" and the second data storage node at logic "1."

During read operations, data lines 22-1 and 22-2 may be precharged (e.g., data signals BL and nBL may be precharged towards Vcc). Word line signal WL may then be asserted (e.g., signal WL may be raised high) to enable access transistors A1 and A2 for reading data from memory cell 18. Sensing circuitry such as sense amplifiers (not shown) may be coupled to the data lines to determine whether memory cell 18 is storing a "0" or a "1."

During write operations, desired data values may be presented on data lines 22-1 and 22-2, and word line signal WL may be asserted to enable access transistors A1 and A2 to pass the desired data values into memory cell 18. For example, signal BL on data line 22-1 may be driven high while signal nBL on data line 22-2 may be driven low to write in a "1" into memory cell 18.

Memory cell 18 of FIG. 2 is merely illustrative and is not intended to limit the scope of the present invention. If desired, memory cell 18 may be formed using more than two cross-coupled inverters or inverter-like circuits, may include any number of access transistors, may include a clear transistor, may include read buffer transistors, may be formed using a multiport memory architecture, etc. More than one memory cell 18 may be coupled to data lines 22-1 and 22-2. A group of memory cells 18 that is coupled to an associated pair of data lines 22-1 and 22-2 is sometimes referred to as a column of memory cells. Each column in array 17 may, for example, include 32 memory cells, 64 memory cells, 128 memory cells, or other suitable numbers of memory cells 18 (e.g., any number of memory cells 18 may be coupled to an associated pair of data lines).

Referring still to FIG. 2, the data lines (or bit lines) 22-1 and 22-2 in each memory column may be coupled to precharge circuitry such as data line precharge circuitry 100 (or bit line precharge circuitry). Precharge circuitry 100 may serve to charge the data lines toward the positive power supply voltage level in preparation for read and write operations and during memory hold operations (e.g., precharge circuitry 100 may be used to drive signals BL and nBL toward Vcc). In the example of FIG. 2, precharge circuitry 100 may receive a clock control signal CLK, an equalizer control signal EQB, the positive power supply voltage signal via line 62, the ground power supply voltage signal via line 62, and other control signals.

Figure 3:
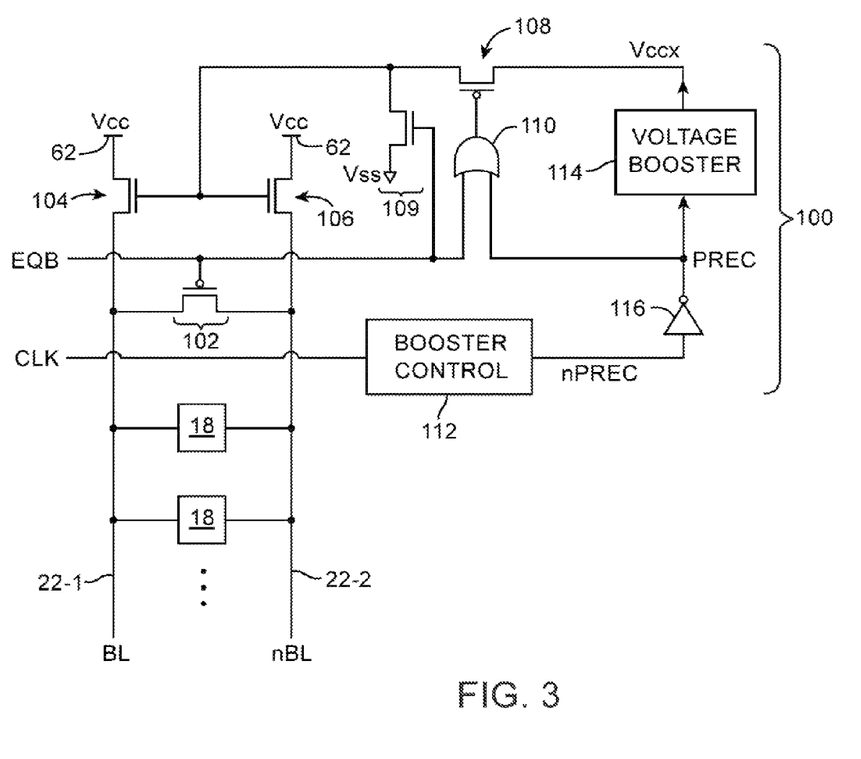
FIG. 3 is a diagram of illustrative precharge circuitry that includes n-channel pull-up transistors in accordance with an embodiment of the present invention.

FIG. 3 is a diagram that shows different circuits that can be part of data line precharge circuitry 100. As shown in FIG. 3, data line precharge circuitry 100 may include n-channel transistors 104, 106, and 109 (e.g., n-type metal-oxide-semiconductor transistors), p-channel transistors 102 and 108 (e.g., p-type metal-oxide-semiconductor transistors), a voltage booster circuit 114, a voltage booster control circuit 112, an inverting circuit such as inverter 116, and a logic OR gate 110.

P-channel transistor 102 may be coupled between the first and second data lines. In particular, transistor 102 may have a first source-drain terminal that is coupled to the first data line, a second source-drain terminal that is coupled to the second data line, and a gate terminal that receives equalizer control signal EQB. Transistor 102 may serve to equalize the voltage level between the first and second data lines (i.e., transistor 102 may be used to reduce the voltage difference between signals BL and nBL to ensure symmetrical data line precharge levels). Transistor 102 is therefore sometimes referred to as an equalizer transistor. When signal EQB is deasserted (i.e., when EQB is high), transistor 102 is turned off. When signal EQB is asserted (i.e., when EQB is low), transistor 102 is turned on. Signal EQB is therefore sometimes referred to as an "active low" signal. This is merely illustrative. If desired, an n-channel transistor may be used as an equalizing device. An n-channel equalizing transistor may be controlled using an "active high" equalizer control signal (e.g., the n-channel equalizing transistor may be turned on when the equalizer control signal is high).

N-channel transistor 104 may have a drain terminal that is coupled to positive power supply line 62, a source terminal that is coupled to first data line 22-1, and a gate terminal. N-channel transistor 104 may have a drain terminal that is coupled to positive power supply line 62, a source terminal that is coupled to second data line 22-2, and a gate terminal. The gate terminals of transistors 104 and 106 may receive a gate control signal Vccx from voltage booster 114 via transistor 108 when transistor 108 is activated (e.g., transistors 104 and 106 may be controlled using gate control signal Vccx by selectively turning on transistor 108). Transistors 104 and 106, when turned on, may be used to charge data lines 22-1 and 22-2 towards the positive power supply voltage level (i.e., Vcc). Transistors 104 and 106 configured in this way may therefore be referred to as data line (or bit line) precharge transistors.

Voltage booster control circuit 112 (sometimes referred to as booster control logic) may receive memory system clock signal CLK and generate a corresponding precharge control signal nPREC. Precharge control signal nPREC may be a gated version of CLK. For example, precharge control signal nPREC may nominally be driven high. A rising edge in signal CLK may trigger a first low pulse for nPREC (e.g., signal nPREC may be temporarily driven low for a first pulse duration). A falling edge in signal CLK may trigger a second low pulse for nPREC after a predetermined delay (e.g., signal nPREC may be temporarily driven low for a second pulse duration a known delay after the falling clock edge). The first pulse duration may be shorter than the second pulse duration. The first and second pulses may sometimes be referred to as rising edge and fall edge pulses, respectively.

Inverter 116 may have an input that receives signal nPREC and an output on which signal PREC is provided. Signal PREC generated in this way may be an inverted version of signal nPREC. Voltage booster 114 may have a control input that receives signal PREC from the output of inverter 116. When precharge control signal nPREC is high (i.e., when PREC is low), voltage booster 114 may drive Vccx to nominal positive power supply voltage level Vcc. When precharge control signal nPREC is driven low (i.e., when PREC is high), voltage booster 114 may be configured to drive Vccx to an elevated voltage level that is greater than Vcc. As an example, circuit 114 may boost Vccx to 2*Vcc. In general, voltage booster 114 may be configured to temporarily boost Vccx to any desired voltage level that is greater than the nominal positive power supply voltage level of Vcc.

As described above, signal Vccx may be used as a gate control signal that is selectively fed to the gates of transistors 104 and 106 via source-drain terminals of p-channel transistor 108 when transistor 108 is activated. Transistor 108 used in this way to selectively isolate voltage booster 114 from the n-channel precharge transistors is sometimes referred to as an isolation device. Transistor 108 may have a gate that is connected to an output of logic OR gate 110. Logic OR gate 110 may have a first input that receives equalizer control signal EQB and a second input that receives signal PREC. Gate 110 may drive its output high when at least one of signals EQB and PREC is high (i.e., gate 110 may only drive its output low when both of signals EQB and PREC are at logic "0").

Isolation transistor 108 configured in this arrangement may be turned off when equalizer control signal EQB is deasserted (e.g., when EQB is high) and when signal PREC is low (e.g., when nPREC is high), thereby generating an output signal having a voltage level of Vcc at the gate of transistor 108. Signals EQB and PREC are typically high and low, respectively, during memory access operations (e.g., during memory read and write operations). Since a low PREC would cause booster circuit 114 to output a Vccx that is equal to Vcc, transistor 108 will be turned off as the difference between the source and gate terminals of p-channel transistor 108 is less than a predetermined threshold voltage Vtp associated with p-channel transistors.

Isolation transistor 108 may be turned on during at least two different scenarios. In a first scenario, equalizer control signal EQB may be asserted (e.g., EQB may be driven low) while signal PREC is low (e.g., when nPREC is high). If both signals EQB and PREC are low, an output signal having a ground voltage level Vss will be fed to the gate of transistor 108. Since a low PREC would cause booster circuit 114 to output a non-boosted gate control signal Vccx that is equal to Vcc, transistor 108 will be turned on as the difference between the source and gate terminals of p-channel transistor 108 is now greater than Vtp (i.e., Vcc minus Vss is greater than p-channel threshold voltage Vtp). During this time, n-channel precharge transistors 104 and 106 may receive at their gates signal Vccx having a voltage level that is equal to the nominal positive power supply voltage level Vcc and may be used to pull the data lines up to an intermediate voltage level that is equal to an n-channel threshold voltage Vtn less than Vcc (e.g., the data lines may be "clamped" to Vcc-Vtn).

In a second scenario, equalizer control signal EQB may be asserted (e.g., EQB may be driven low) while signal PREC is high (e.g., when nPREC is low). If PREC is high, an output signal having a voltage level of Vcc will be fed to the gate of transistor 108. Since a high PREC would cause booster circuit 114 to output a Vccx that is greater Vcc, transistor 108 will be turned on as the difference between the source and gate terminals of p-channel transistor 108 is now greater than Vtp (i.e., elevated Vccx minus Vcc should be greater than p-channel threshold voltage Vtp). In other words, it may be desirable for boosted Vccx to be at least greater than or equal to Vcc+Vtp. In the example where Vccx is boosted to 2*Vcc, driving the gate of transistor 108 to Vcc can also help to prevent oxide breakdown. During this time, n-channel precharge transistors 104 and 106 may receive at their gates signal Vccx having a voltage level that is equal to the boosted voltage level and may be used to pull the data lines all the way up to nominal positive power supply voltage Vcc. In other words it may also be desirable for the boosted Vccx to be at least greater than or equal to Vcc+Vtn to ensure that n-channel precharge transistors 104 and 106 are capable of pulling the data lines all the way up to Vcc.

The first scenario described above during which the data lines are clamped to Vcc-Vtn may be referred to herein as a non-boosted precharge period, whereas the second scenario described above during which the data lines are pull up towards full Vcc may be referred to as a boosted precharge period. During the non-boosted precharge period, charging the data lines to only Vcc-Vtn can help reduce cell leakage, thereby reducing power consumption. During the boosted precharge period, overdriving the n-channel precharge transistors with boosted gate voltages can help increase the drive strengths of transistors 104 and 106, resulting in improved precharge speeds and improved memory performance. The example of FIG. 3 in which isolation transistor is a p-channel transistor is merely illustrative. If desired, isolation transistor 108 may be implemented using an n-channel transistor or other suitable type of switches for selectively passing control signals.

During non-precharge periods (e.g., when equalizer control signal EQB is deasserted or high), n-channel transistor 109 may be turned on to pull the voltage at the gate terminals of n-channel precharge transistors 104 and 106 down towards ground level Vss, thereby turning off transistors 104 and 106. Transistor 109 may therefore serve to disconnect the n-channel precharge transistors from the data lines during non-precharge periods (i.e., to deactivate the precharge transistors) and may therefore sometimes be referred to as a pull-down precharge-deactivating transistor.

The implementation of precharge circuitry 100 in FIG. 3 that includes n-channel precharge transistors, a p-channel equalizing device, a voltage booster circuit, a booster isolation device, and other associated control logic is merely illustrative and do not serve to limit the scope of the present invention. If desired, precharge circuitry 100 may be configured to provide other types of voltage boosting or reduction schemes for controlling the gates of the n-channel precharge transistors.

Figure 4:
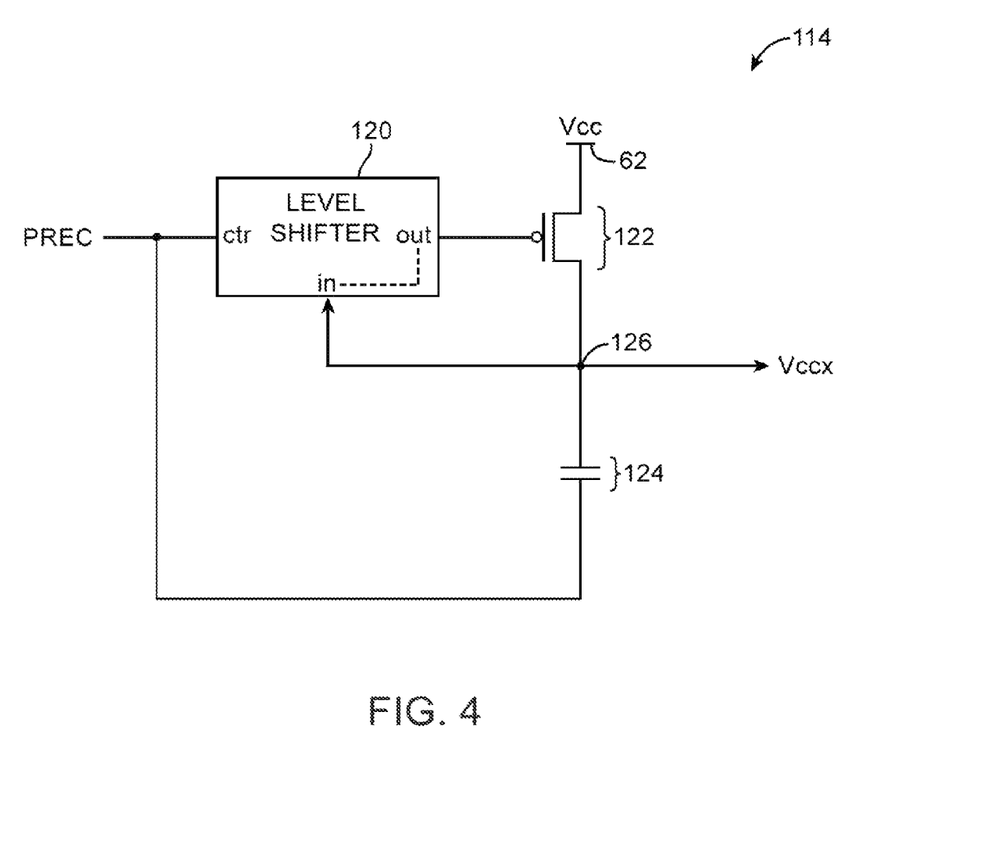
FIG. 4 is a diagram of an illustrate voltage booster circuit in accordance with an embodiment of the present invention.

FIG. 4 is a circuit diagram showing one suitable implementation of voltage booster 114. As shown in FIG. 4, booster circuit 114 may include a level shifter circuit 120, a p-channel transistor 122, and a capacitive circuit 124 (e.g., a capacitor). Capacitor 124 may be formed using metal-oxide-metal (MOM) capacitor configurations (sometimes referred to as metal-insulator-metal or MIM capacitors), metal-oxide-semiconductor capacitors (MOSCAPs), or other suitable types of on-chip capacitor configurations.

Voltage booster 114 may have an input that receives signal PREC from inverter 116 and an output 126 on which gate control signal Vccx is provided. Level shifter 120 may have a first (control) input that receives signal PREC, a second input that is coupled to output 126, and an output. When the first input receives a low PREC signal, level shifter 120 may drives its output low. When the first input receives a high PREC signal, level shifter 120 may short its second input to its output.

P-channel transistor 122 may have a source terminal that is coupled to positive power supply line 62, a drain terminal that is coupled to booster output 126, and a gate that is coupled to the output of level shifter 120. Capacitor 124 may have a first terminal that is coupled to booster output 126 and a second terminal that is coupled to the input of voltage booster 114.

Connected in this arrangement, the circuitry within voltage booster 114 may be used to perform voltage doubling. For example, consider a scenario in which signal PREC is initially low. When PREC is low, level shifter 120 will generate a low output signal to turn on p-channel transistor 122 and charge node 126 to Vcc. As a result, capacitor 124 will exhibit a voltage difference of Vcc across its terminals.

When PREC is driven high during voltage boosting periods, level shifter 120 will short its second input to its output. Doing so will cause level shifter 120 to provide a high output signal, which turns off p-channel transistor 122. Since the voltage at node 126 does not have a direct path to a current source or sink, the voltage across capacitor 124 should not change (e.g., capacitor 124 has nowhere to discharge since output 126 is "floating" and no longer actively driven). Therefore, when signal PREC is driven high (i.e., when PREC is increased from Vss to Vcc), voltage Vccx at node 126 will be similarly be increased by Vcc since the voltage across the capacitor remains fixed (e.g., Vccx will increase from Vcc to 2*Vcc when PREC is driven high and will decrease from 2*Vcc to Vcc when PREC is driven low). The voltage doubling circuit of FIG. 4 is merely illustrative. If desired, other types of voltage boosting circuits may be used to provide any suitable amount of voltage boosting above nominal voltage level Vcc.

Figure 5:
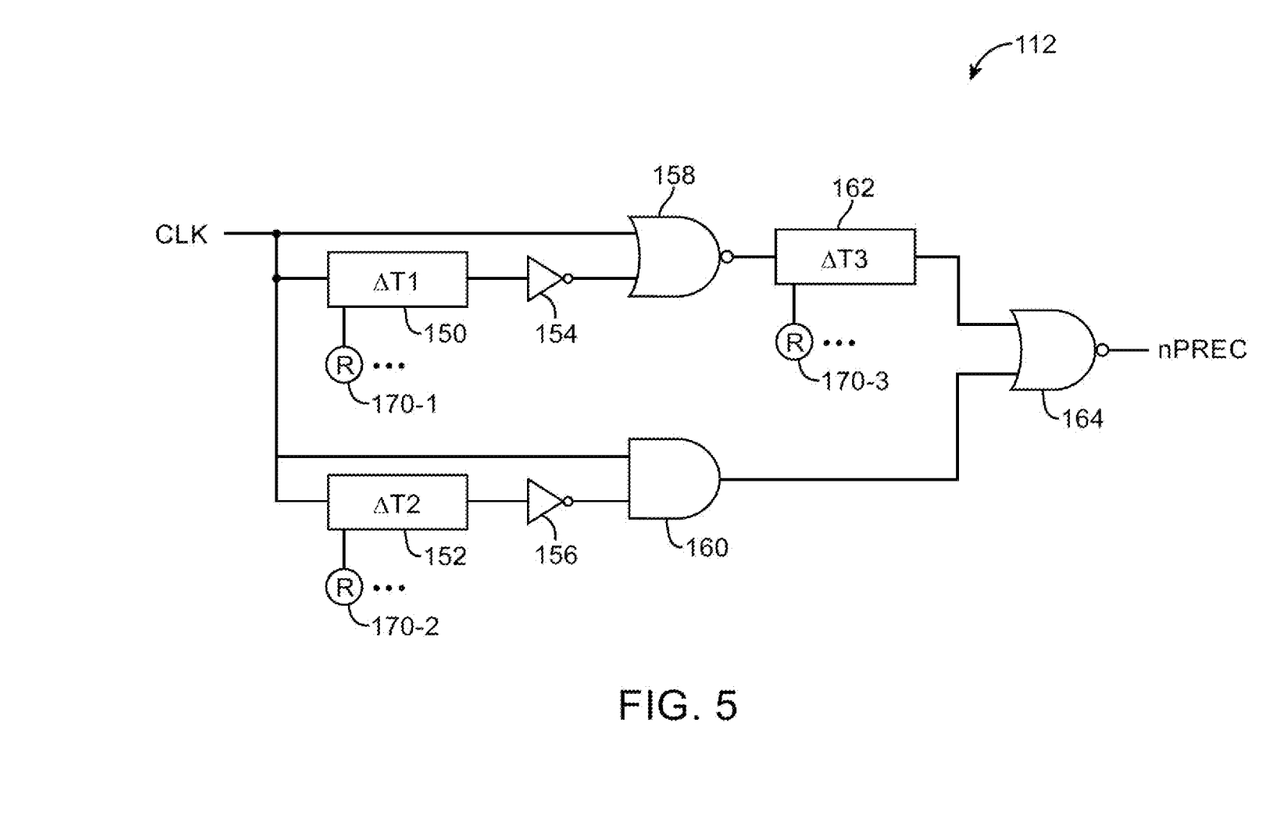
FIG. 5 is a diagram of an illustrative voltage booster control logic circuit in accordance with an embodiment of the present invention.

FIG. 5 shows one suitable circuit implementation of voltage booster control logic 112. As shown in FIG. 5, booster control logic 122 may include a first delay circuit 150, a second delay circuit 152, a third delay circuit 162, inverters 154 and 156, logic NOR gates 158 and 164, and a logic AND gate 160. Control logic 112 may have an input that receives memory clock signal CLK and an output on which precharge control signal nPREC is generated.

Logic NOR gate may have a first input configured to receive CLK directly, a second input configured to receive an inverted version of CLK via delay circuit 150 and inverter 154, and an output. Logic AND gate may have a first input configured to receive CLK directly, a second input configured to received an inverted version of CLK via delay circuit 152 and inverter 156, and an output. Logic NOR gate 164 may have a first input that is coupled to the output of gate 158 via delay circuit 162, a second input that is coupled to the output of gate 160, and an output on which signal nPREC is generated.

Control logic 112 configured in this arrangement may nominally drive nPREC high (i.e., to a logic "1" or Vcc). In response to a rising CLK edge, signal nPREC may be temporarily driven low for a pulse duration that is approximately equal to the delay ΔT2 of circuit 152. In response to a falling CLK edge, logic 112 may wait for a delay ΔT3 of circuit 162 before driving nPREC low. Signal nPREC may be driven low for a duration that is approximately equal to delay ΔT1 of circuit 154 (e.g., the nPREC pulse may be delayed by ΔT3 after the falling clock edge).

In one suitable embodiment, delay ΔT1 may be greater than ΔT2. If desired, delay circuits 150, 152, and 162 may be controlled using control bits stored in storage elements 170. Each storage element 170 may be a volatile memory element (e.g., a CRAM cell loaded with configuration data, etc.) or a nonvolatile memory element (e.g., fuses, antifuses, electrically-programmable read-only memory elements, etc.). In the example of FIG. 5, delay circuit 150 may be programmed using bits from elements 170-1; delay circuit 152 may be programmed using bits from elements 170-2; and delay circuit 162 may be programmed using bits from elements 170-3. Storage elements 170 (e.g., elements 170-1, 170-2, and 170-3) may be used to store a desired pattern of data bits for configuring each of delay circuits 150, 152, and 162 with the desired amount of delay.

Figure 6:
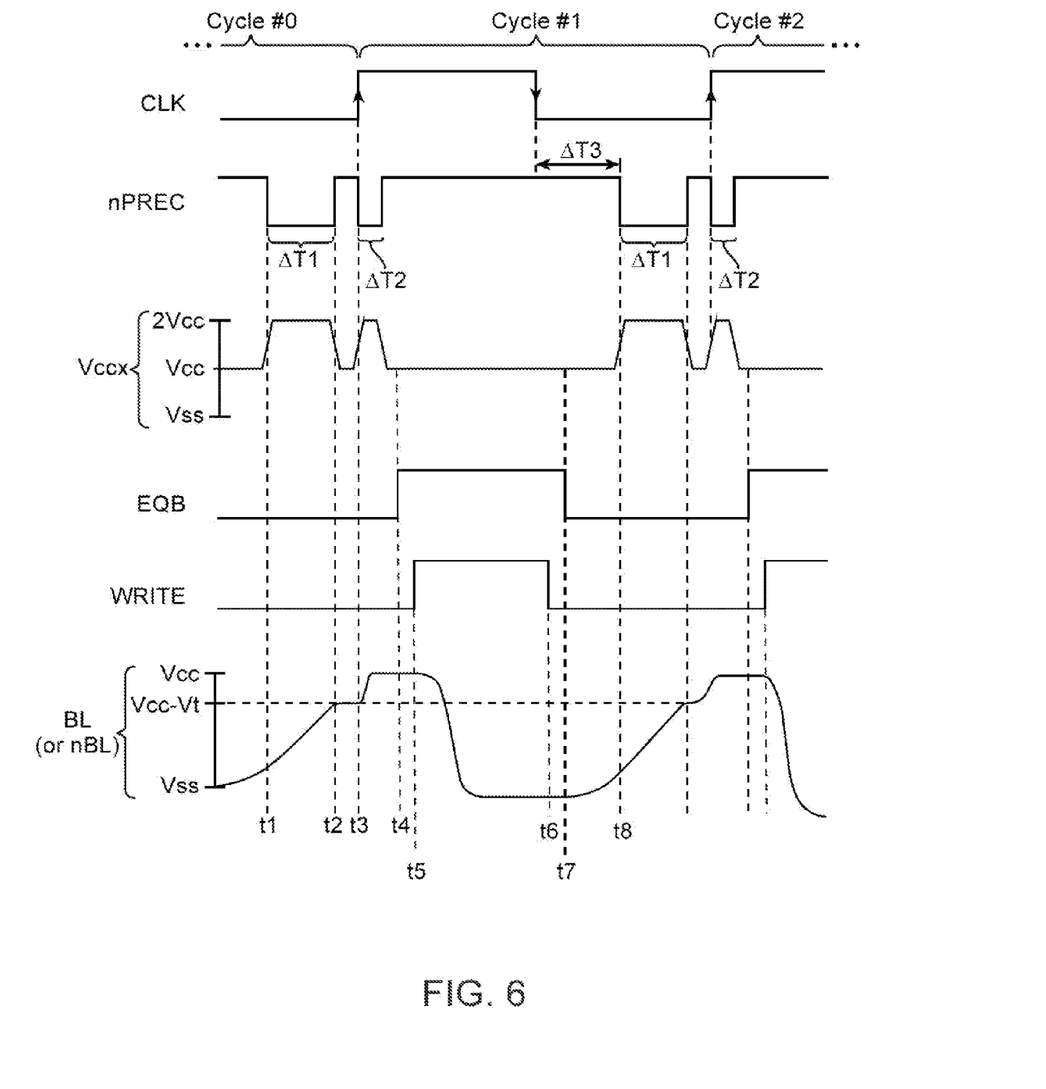
FIG. 6 is a timing diagram illustrating the behavior of relevant signals during operation of the precharge circuitry of the type shown in FIG. 3 in accordance with an embodiment of the present invention.

FIG. 6 is a timing diagram that illustrates the operation of precharge circuitry 100 when performing successive write cycles. In the example of FIG. 6, assume that signal BL is driven low during cycle #0 to drive a logic "0" into a selected memory cell. At time t1 (after the write operation of cycle #0 is complete), precharge control signal nPREC may be pulsed low for duration ΔT1. During this time when signal nPREC is driven low and when equalizer control signal EQB is low (i.e., from time t1 to t2), Vccx may be driven to a boosted voltage level (e.g., 2*Vcc) using booster circuit 114, and BL may be driven up towards Vcc. Duration ΔT1 may be selected so that BL (and/or nBL) is driven up to approximately Vcc-Vtn by the end of this first pulse duration. At time t2, signal nPREC is driven high, and the data lines are clamped to Vcc-Vtn.

A rising CLK edge (at time t3) starts a subsequent write cycle (e.g., cycle #1) and triggers precharge control signal nPREC to be pulsed low for duration ΔT2. During this time (i.e., for duration ΔT2 following time t3), Vccx may again be driven to the boosted voltage level to drive BL (and/or nBL) towards Vcc. Duration ΔT2 may be selected so that BL (or nBL) is driven up to approximately Vcc by the end of this second pulse duration. Signal nPREC may be driven back high at the end of the second pulse.

At time t4, signal EQB may be deasserted to prevent precharge circuit 100 from charging the data lines (e.g., EQB may be driven high to turn on pull-down transistor 109, thereby shutting down the n-channel precharge transistors). At time t5, a write operation may be performed to write a desired value into the selected memory cell by asserting write control signal WRITE. During write operations, one of the data line signals may once again be driven low (e.g., BL may again be drive to Vss as shown in the example of FIG. 6).

At time t6, the write operation may be complete and control signal WRITE may be deasserted. At time t7, equalizer control signal EQB may again be asserted to begin precharging the data lines. After a delay ΔT3 following the falling edge of signal CLK (at time t8), signal nPREC may again be driven low for duration ΔT1 in preparation for the next memory cycle #2. This method of precharging data lines may sometimes be referred to as "double boosted bit line precharge" since one complete precharge operation is performed using two separate pulse periods, where the gate control signal of the precharge pull-up transistors is boosted during each of the two separate pulses.

Precharging data lines using two separate pulse periods during which the n-channel transistors are overdriven can help reduce leakage and improve memory access speeds. The example of FIG. 6 in which the double boosted data line precharge method is applied to memory write operations is merely illustrative. If desired, double boosted data line precharging of this type may be used during memory read operations, or other suitable memory operations.

Figure 7:
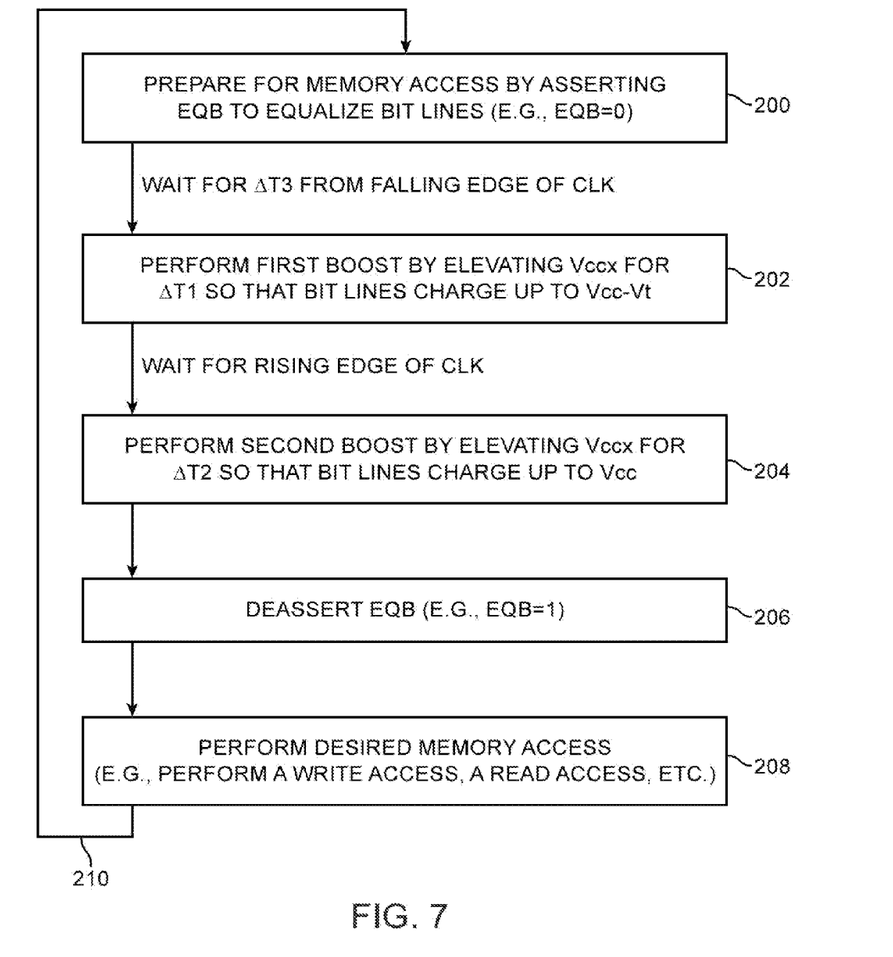
FIG. 7 is a flow chart of illustrative steps for operating the precharge circuitry of the type shown in FIG. 3 in accordance with an embodiment of the present invention.

FIG. 7 is a flow chart of illustrative steps involved in operating precharge circuitry 100 of the type described in connection with FIG. 3. At step 200, equalizer control signal EQB may be asserted to prepare the memory column for a memory access (e.g., signal EQB may be driven low to equalize the data lines).

After a predetermined delay ΔT3 following the falling edge of signal CLK, a first boost may be performed by elevating gate control signal Vccx for ΔT1 (step 202). At the end of period ΔT1, the data lines may be clamped to Vcc-Vtn.

In response to a rising edge in signal CLK, a second boost may be performed by elevating Vccx for ΔT2 (step 204). At the end of period ΔT2, the data lines may be precharged to nominal positive power supply voltage level Vcc.

At step 206, equalizer control signal EQB may be deasserted (e.g., signal EQB may be driven high to deactivate precharge circuitry 100). At step 208, a desired memory access may be performed (e.g., a write access or a read access may be performed). After the desired memory access operation has been performed, processing may loop back to step 200 to prepare for a subsequent memory access (as indicated by path 210).

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit, comprising:
a data line;
a memory element that is coupled to the data line; and
precharge circuitry that is coupled to the data line, wherein the precharge circuitry includes:
a precharge transistor that pulls the data line up towards a positive power supply voltage level and that receives a gate control signal having a boosted voltage level that is greater than the positive power supply voltage level; and
an equalizer transistor that is directly coupled to the data line and that is controlled by an equalizer control signal that is different than the gate control signal, wherein the gate control signal is controlled by the equalizer control signal.

2. The integrated circuit defined in claim 1, wherein the precharge transistor comprises an n-channel transistor.

3. The integrated circuit defined in claim 2, wherein the precharge transistor has a drain terminal that is coupled to a power supply line that is biased to the positive power supply voltage level, a source terminal that is coupled to the data line, and a gate terminal that receives the gate control signal.

4. The integrated circuit defined in claim 1, further comprising:
an additional data line that is coupled to the memory element, wherein the precharge circuitry further includes another precharge transistor for pulling the additional data line towards the positive power supply voltage level, and wherein the another precharge transistor is operable to receive the gate control signal.

5. The integrated circuit defined in claim 1, wherein the precharge circuitry further comprises:
a voltage booster circuit operable to generate the gate control signal.

6. The integrated circuit defined in claim 5, wherein the precharge circuitry further comprises:

control logic that receives a clock signal and that produces a precharge control signal that controls the voltage booster circuit.

7. The integrated circuit defined in claim 6, wherein the voltage booster circuit is configured to output the gate control signal having the boosted voltage level when the precharge control signal is at a first value, and wherein the voltage booster circuit is configured to output the gate control signal having a nominal voltage level that is equal to the positive power supply voltage level when the precharge control signal is at a second value that is different than the first value.

8. The integrated circuit defined in claim 7, wherein the voltage booster circuit is configured to output the gate control signal having the boosted voltage level in response to rising and falling clock edges in the clock signal.

9. The integrated circuit defined in claim 5, wherein the precharge circuitry further comprises:
an isolation transistor interposed between the voltage booster circuit and the precharge transistors; and
a logic gate having a first input that receives the equalizer control signal, a second input that receives the precharge control signal, and an output that is coupled to the isolation transistor.

10. The integration circuit defined in claim 1 wherein the pre charge circuitry further comprises:
a pull-down transistor that is controlled by the equalizer control signal, wherein the pull-down transistor deactivates the pre charge transistors when the equalizer control signal is de asserted.

11. A method of using precharge circuitry to precharge data lines associated with a plurality of memory elements, wherein the precharge circuitry receives a clock signal and includes precharge transistors, the method comprising:
in response to a falling edge in the clock signal, providing a boosted voltage signal to the precharge transistors for a first duration; and
in response to a rising edge in the clock signal, providing the boosted voltage signal to the precharge transistors for a second duration that is different than the first duration.

12. The method defined in claim 11, wherein the precharge transistors comprise n-channel precharge transistors, the method further comprising:
pulling the data lines up towards a positive power supply voltage level with the n-channel precharge transistors, wherein the boosted voltage signal has an elevated voltage level that is greater than the positive power supply voltage level.

13. The method defined in claim 12, further comprising:
when the boosted voltage signal is not being provided to the precharge transistors, providing a non-boosted voltage signal to the precharge transistors, wherein the non-boosted voltage signal has a nominal voltage level that is equal to the positive power supply voltage level.

14. The method defined in claim 11, wherein the first duration is longer than the second duration.

15. The method defined in claim 11, wherein providing the boosted voltage signal to the precharge transistors in response to the falling clock edge comprises providing the boosted voltage signal to the precharge transistors a predetermined amount of delay after the falling edge of the clock signal.

16. A method of using precharge circuitry to precharge data lines that are coupled to a plurality of memory elements, wherein the precharge circuitry includes precharge transistors, the method comprising:

during a first time period, providing a boosted voltage signal to the precharge transistors to precharge the data lines to an intermediate voltage level; and during a second time period, providing the boosted voltage signal to the precharge transistors to precharge the data lines to a positive power supply voltage level, wherein the intermediate voltage level is less than the positive power supply voltage level, and wherein the boosted voltage signal has an elevated voltage level that is greater than the positive power supply voltage level.

17. The method defined in claim 16, wherein the precharge transistors comprise n-channel precharge transistors having gate terminals, the method further comprising:

receiving the boosted voltage signal at the gate terminals of the n-channel precharge transistors.

18. The method defined in claim 16, wherein the first time period is longer than the second time period.

19. The method defined in claim 16, further comprising:

driving the data lines to the intermediate voltage level by providing a non-boosted voltage signal to the precharge transistors during other time periods, wherein the non-boosted voltage signal has a nominal voltage level that is equal to the positive power supply voltage level.

\* \* \* \* \*